(12) United States Patent
Delia et al.

(10) Patent No.: US 12,745,585 B2
(45) Date of Patent: Sep. 22, 2026

(54) WAFER CLEANING METHOD AND SYSTEM USING HEATED FUNCTIONAL PLATE

(71) Applicant: Tokyo Electron Limited, Tokyo (JP)

(72) Inventors: Peter Delia, Albany, NY (US); Ronald Nasman, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/634,411

(22) Filed: Apr. 12, 2024

(65) Prior Publication Data

US 2025/0323035 A1 Oct. 16, 2025

(51) Int. Cl.
*H10P 70/00* (2026.01)
*H10P 72/00* (2026.01)

(52) U.S. Cl.
CPC .......... *H10P 72/0414* (2026.01); *H10P 70/20* (2026.01); *H10P 72/0406* (2026.01); *H10P 72/0408* (2026.01); *H10P 70/15* (2026.01); *H10P 70/56* (2026.01)

(58) Field of Classification Search
CPC ... H01L 21/67017–67086; H10P 70/56; H10P 72/0402–0426
See application file for complete search history.

(56) References Cited

U.S. PATENT DOCUMENTS 6,145,519 A * 11/2000 Konishi ............ H01L 21/67057 257/E21.228
2002/0062840 A1* 5/2002 Verhaverbeke ... H01L 21/67051 134/33
2008/0145190 A1* 6/2008 Yassour .................. H01L 21/00 294/64.3
2012/0006356 A1* 1/2012 Kamikawa ........ H01L 21/67051 134/10
2013/0081297 A1* 4/2013 Nakashima ....... H01L 21/67034 34/201
2014/0127908 A1* 5/2014 Okutani ............ H01L 21/02068 118/58
2015/0187624 A1* 7/2015 Gleissner .......... H01L 21/68792 156/345.55
2020/0035516 A1* 1/2020 Ikeda ................ H01L 21/67051
2020/0075358 A1 3/2020 Abel et al.
2023/0405642 A1 12/2023 Hu et al.
2024/0021444 A1* 1/2024 Subbanna ......... H01L 21/67248
2024/0363374 A1* 10/2024 Sowwan ................ C30B 25/10

FOREIGN PATENT DOCUMENTS

KR 100877110 B1 * 1/2009

* cited by examiner

*Primary Examiner* — Kaj K Olsen
*Assistant Examiner* — Richard Z. Zhang
(74) *Attorney, Agent, or Firm* — Oblon, McClelland, Maier & Neustadt, L.L.P.

(57) ABSTRACT

A wafer processing method and system are provided. The wafer processing system includes a controller configured to control a dispense nozzle of the wafer processing system to dispense distilled IPA liquid onto a semiconductor wafer in a processing space between two plates of the wafer processing system. The controller is further configured to control one or more heating elements of one of the two plates to heat the one of the two plates to vaporize the distilled IPA liquid into IPA vapor, and control the dispense nozzle to dispense a gas into the processing space to dry the semiconductor wafer.

10 Claims, 4 Drawing Sheets

WAFER CLEANING METHOD AND SYSTEM USING HEATED FUNCTIONAL PLATE

FIELD OF THE INVENTION

This disclosure relates generally to the processing and surface preparation of semiconductor wafers, and particularly to a method and wafer processing system for cleaning of such wafers.

BACKGROUND

Semiconductor fabrication involves many different steps of depositing, growing, patterning, removal, and cleaning of wafers. The cleaning of the wafers can be referred to as wafer cleaning process, which includes rinsing the wafers using deionized water, displacing the deionized water with isopropyl alcohol (IPA) liquid to reduce the risks of pattern collapses on the wafers, and drying the wafers. However, the use of the IPA liquid can introduce significant particle contamination onto the wafers. Accordingly, there is a demanding need to reduce the particle contamination during the IPA supply.

SUMMARY

This disclosure provides a wafer cleaning method. The wafer cleaning method includes dispensing distilled isopropyl alcohol (IPA) liquid through a dispense nozzle of a wafer processing system onto a semiconductor wafer in a processing space between two plates of the wafer processing system, enabling one or more heating elements of one of the two plates to heat the one of the two plates to vaporize the distilled IPA liquid into IPA vapor, and dispensing a gas through the dispense nozzle of the wafer processing system into the processing space to dry the semiconductor wafer.

Aspects of the disclosure provide a wafer processing system. The wafer processing system includes a controller configured to control a dispense nozzle of the wafer processing system to dispense distilled IPA liquid onto a semiconductor wafer in a processing space between two plates of the wafer processing system. The controller is further configured to control one or more heating elements of one of the two plates to heat the one of the two plates to vaporize the distilled IPA liquid into IPA vapor, and control the dispense nozzle to dispense a gas into the processing space to dry the semiconductor wafer.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Reference throughout this specification to "one embodiment" or "an embodiment" means that a particular feature, structure, material, or characteristic described in connection with the embodiment is included in at least one embodiment of the application, but do not denote that they are present in every embodiment. Thus, the appearances of the phrases "in one embodiment" or "in an embodiment" in various places throughout this specification are not necessarily referring to the same embodiment of the application. Furthermore, the particular features, structures, materials, or characteristics may be combined in any suitable manner in one or more embodiments.

In semiconductor device manufacturing, wafer cleaning process can involve rinsing a wafer surface of a semiconductor wafer using deionized water (DIW), displacing the DIW using isopropyl alcohol (IPA) to prevent pattern collapses on the semiconductor wafer, and then drying the wafer surface using a clean gas such as nitride gas. In an example, liquid IPA is used in the wafer cleaning process. However, since the liquid IPA is the last liquid used in the process, it can introduce significant particle contamination into the process. Accordingly, there is a need to use vaporized IPA in the process.

Aspects of the disclosure provide methods and systems to provide vaporized IPA by using a heated functional plate.

Figure 1:
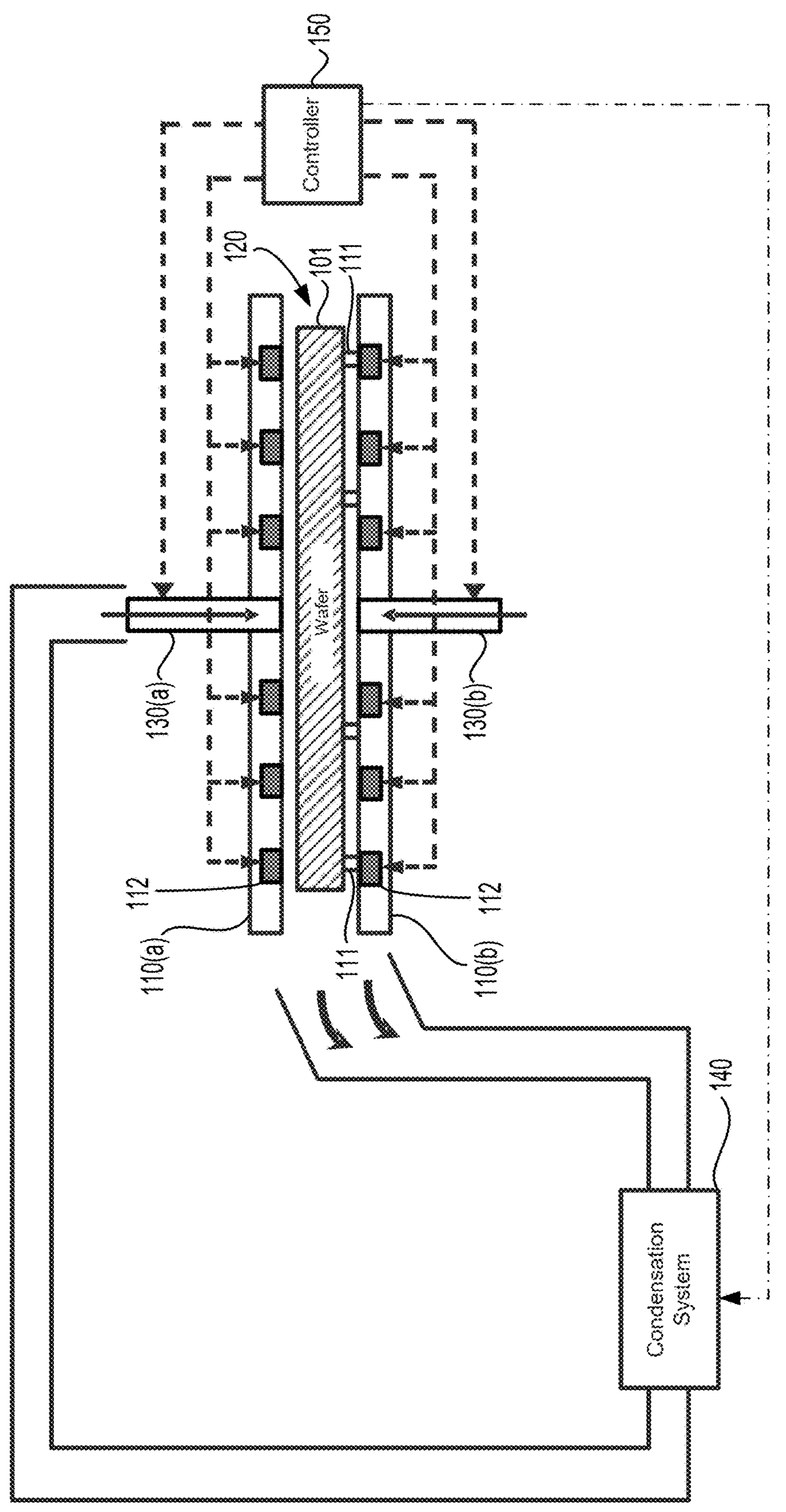
FIG. 1 illustrates a schematic of a wafer processing system according to an embodiment of the disclosure.

FIG. 1 illustrates a schematic of a wafer processing system 100 according to an embodiment of the disclosure. The wafer processing system 100 includes two functional plates 110(*a*) and 110(*b*). A processing space 120 can be formed between the two functional plates 110(*a*) and 110(*b*). Within the processing space 120, a semiconductor wafer 101 can be processed. Specifically, the semiconductor wafer 101 can be supported on a plurality of pins 111 that extend from the bottom plate 110(*b*) into the processing space 120.

According to aspects of the disclosure, at least one of the functional plates 110(*a*) and 110(*b*) can include one or more heating elements 112.

In an embodiment, the one or more heating elements 112 can include one or more light sources such as a light emitting diode (LED) array or a laser array.

In an embodiment, the one or more heating elements 112 can be implemented based on resistive heating or Peltier effect.

In an embodiment, in order to conduct the thermal energy generated by the one or more heating elements 112, the functional plates 110(*a*) and/or 110(*b*) can include one or more heat exchangers.

In an embodiment, the functional plates 110(*a*) and/or 110(*b*) can include a heat conducting material. In an example, the functional plates 110(*a*) and/or 110(*b*) can include a metal material coated with ethylene chlorotrifluoroethylene. In an example, the functional plates 110(*a*) and/or 110(*b*) can include at least one of an impervious synthetic graphite material, a silicon carbide material, or a ceramic material.

The wafer processing system 100 can include chemical dispense nozzles 110(*a*) and 110(*b*). During processing the semiconductor wafer 101, one or more liquid chemical solutions (e.g., hot phosphoric acid) can be dispensed through the chemical dispense nozzles 110(*a*) and/or 110(*b*) onto one or two surfaces of the semiconductor wafer 101 to process the one or two surfaces of the semiconductor wafer 101.

In an embodiment, the semiconductor wafer 101 can be always stationary within the processing space 120. The one or more liquid chemical solutions can be continuously or discontinuously dispensed during processing the semiconductor wafer 101. Specifically, the functional plates 110(*a*) and 110(*b*) physically confine the one or more liquid chemical solutions within the relatively small and enclosed processing space 120, forcing the one or more liquid chemical solutions to flow radially across the surfaces of the semiconductor wafer 101 without the need to rotate the semiconductor wafer 101. After the semiconductor wafer 101 is processed, a wafer cleaning process can be performed.

Figures 2A, 2B:
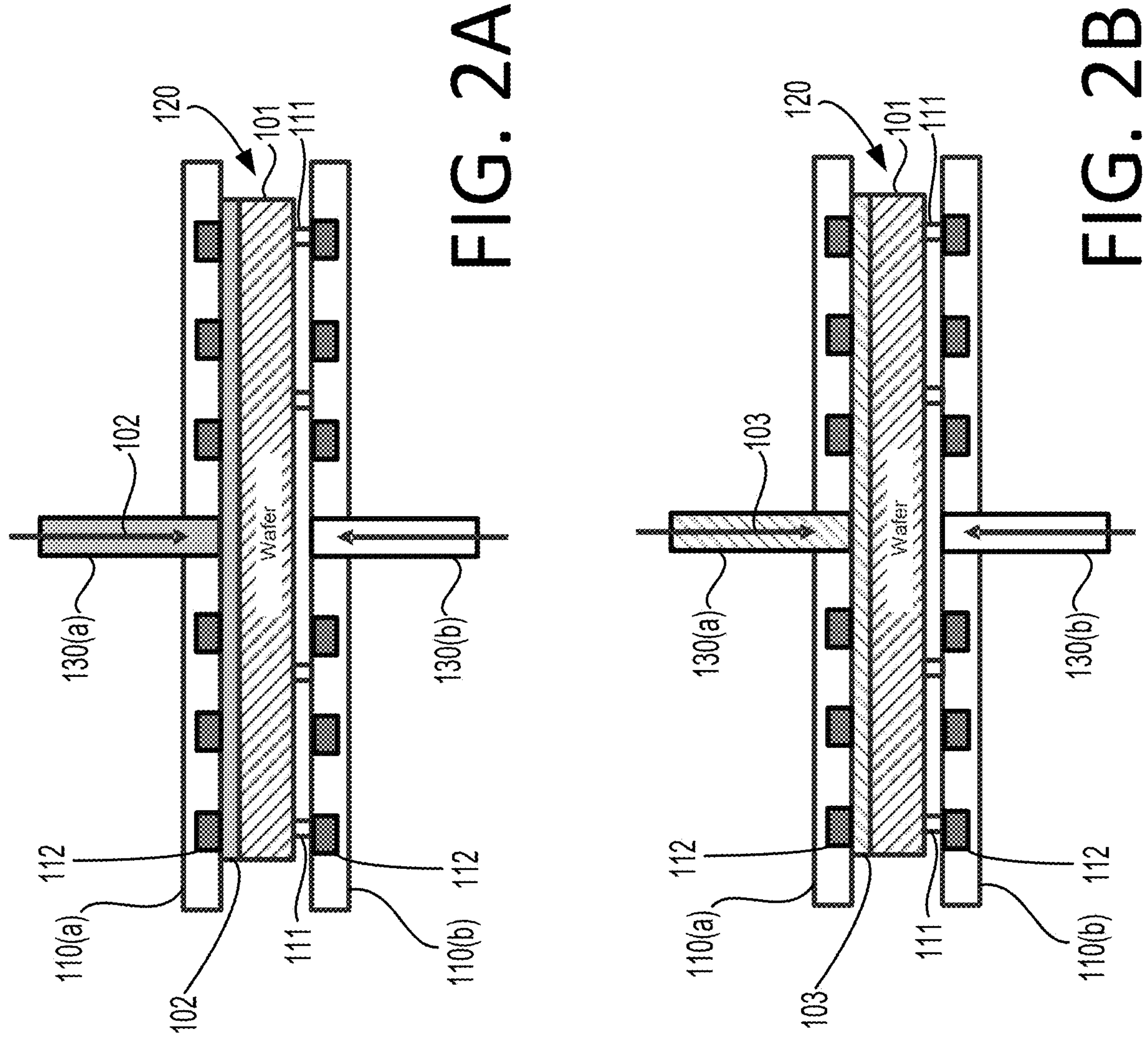
FIGS. 2A-2D illustrate a wafer cleaning process according to an embodiment of the disclosure.
Figures 2C, 2D:
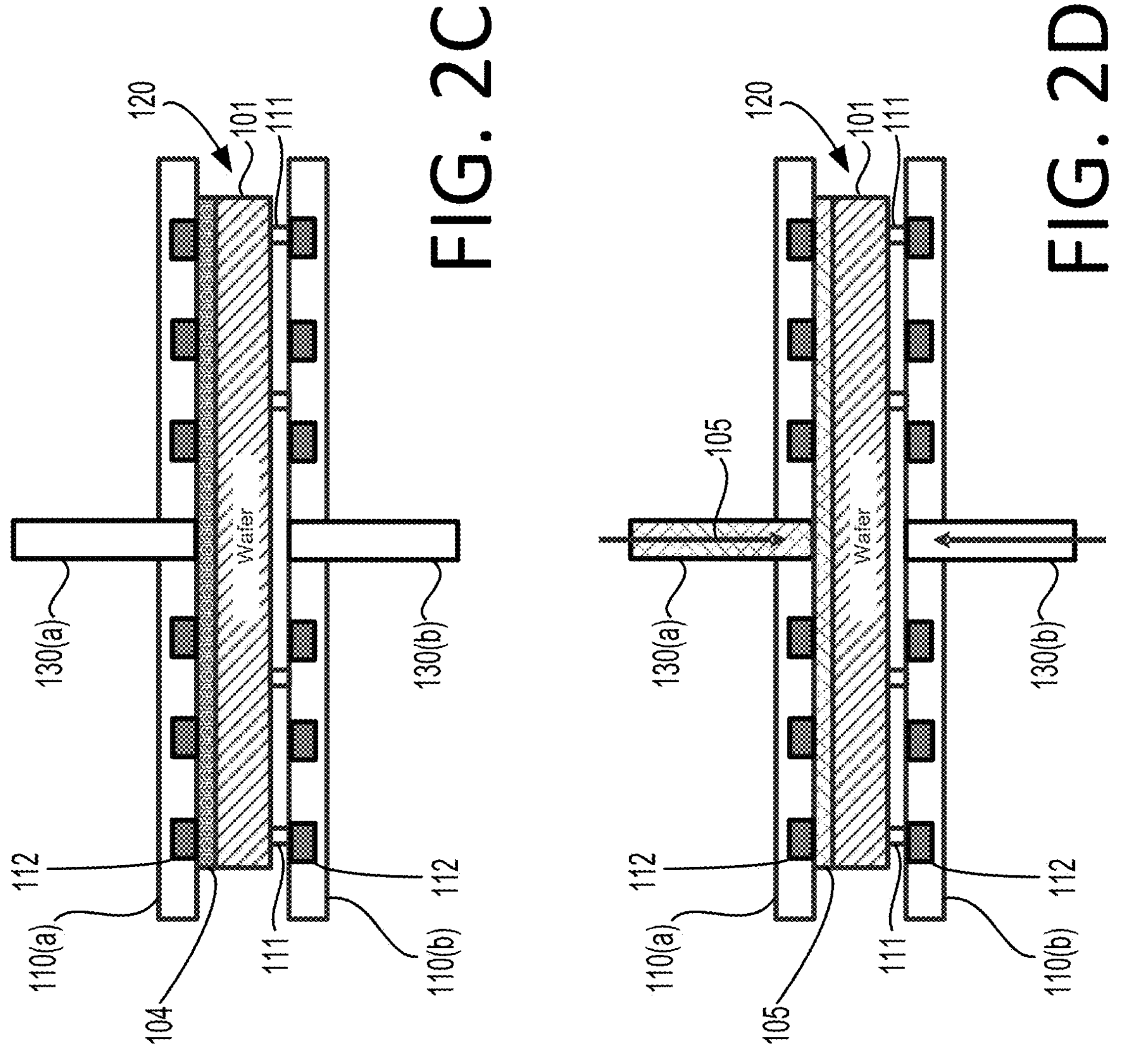

FIGS. 2A-2D show a wafer cleaning process 200 according to an embodiment of the disclosure. As shown in FIG. 2A, the process 200 can dispense the DIW 102 through the chemical dispense nozzles 110(*a*) and/or 110(*b*) to rinse the wafer surfaces of the semiconductor wafer 101. Then, as shown in FIG. 2B, the process 200 can dispense the distilled high purity IPA liquid 103 through the chemical dispense nozzles 110(*a*) and/or 110(*b*) to displace the DIW. After the distilled high purity IPA liquid 103 is dispensed onto the semiconductor wafer 101, the process 200 can close the chemical dispense nozzles 110(*a*) and/or 110(*b*) and enable a heating function of the functional plates 110(*a*) and/or 110(*b*). The heating function of the functional plates 110(*a*) and/or 110(*b*) can be implemented by the one or more heating elements 112. As shown in FIG. 2C, when the temperature of the heated functional plates 110(*a*) and/or 110(*b*) is above the IPA vaporization temperature, the distilled high purity IPA liquid 103 can be vaporized into IPA vapor 104. By using the IPA vapor 104 in the wafer cleaning process, the particle contamination can be reduced. Further, as shown in FIG. 2D, the process 200 can displace the IPA vapor 104 by dispensing a clean gas 105 (e.g., nitrogen gas) through the dispense nozzles 110(*a*) and/or 110(*b*) into the processing space 120.

It is noted that although the DIW 102, the IPA liquid 103, and the clean gas 105 are dispensed through the chemical dispense nozzle 110(*a*) in FIGS. 2A-2D, these liquid and gas can also be dispensed through the chemical dispense nozzle 110(*b*).

Referencing back to FIG. 1, the wafer processing system 100 can include a condensation system 140 that exhausts the IPA vapor 104 from the processing space 120 and condenses the IPA vapor 104 into the IPA liquid 103. The condensed IPA liquid 103 can be reused in the wafer cleaning process.

The wafer processing system 100 can further include a controller 150 that provides control signals to the functional plates 110 including the heating elements 112, the chemical dispense nozzles 130, and the condensation system 140. The controller 150 can initiate a wafer cleaning process of cleaning the semiconductor wafer 101 in the processing space 120 between the two functional plates 110 of the wafer processing system 100. During cleaning the semiconductor wafer 101, the controller 150 can control the chemical dispense nozzles 130 to dispense the DIW 102 to rinse the surfaces of the semiconductor wafer 101, dispense the IPA liquid 103 to reduce the risk of pattern collapse on the semiconductor wafer 101, and dispense the clean gas 105 to dry the surfaces of the semiconductor wafer 101. The controller 150 can further control the heating elements 112 of the functional plates 110 to heat the functional plates 110 so that the IPA liquid 103 can be vaporized into the IPA vapor 104. The controller 150 can control the condensation system 140 to exhaust the IPA vapor 104 from the processing space 120 and condense the IPA vapor 104 into the IPA liquid 103.

It is noted that the controller 150 can be implemented in a wide variety of manners. For example, any controller can be a computer and/or include one or more programmable integrated circuits that are programmed to provide the functionality described herein. One or more processors (e.g., microprocessor, microcontroller, central processing unit, etc.), programmable logic devices (e.g., complex programmable logic device (CPLD)), field programmable gate array (FPGA), etc.), and/or other programmable integrated circuits can be programmed with software or other programming instructions to implement the functionality described herein for controller. It is further noted that the software or other programming instructions can be stored in one or more non-transitory computer-readable mediums (e.g., memory storage devices, flash memory, dynamic random access memory (DRAM), reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

Figure 3:
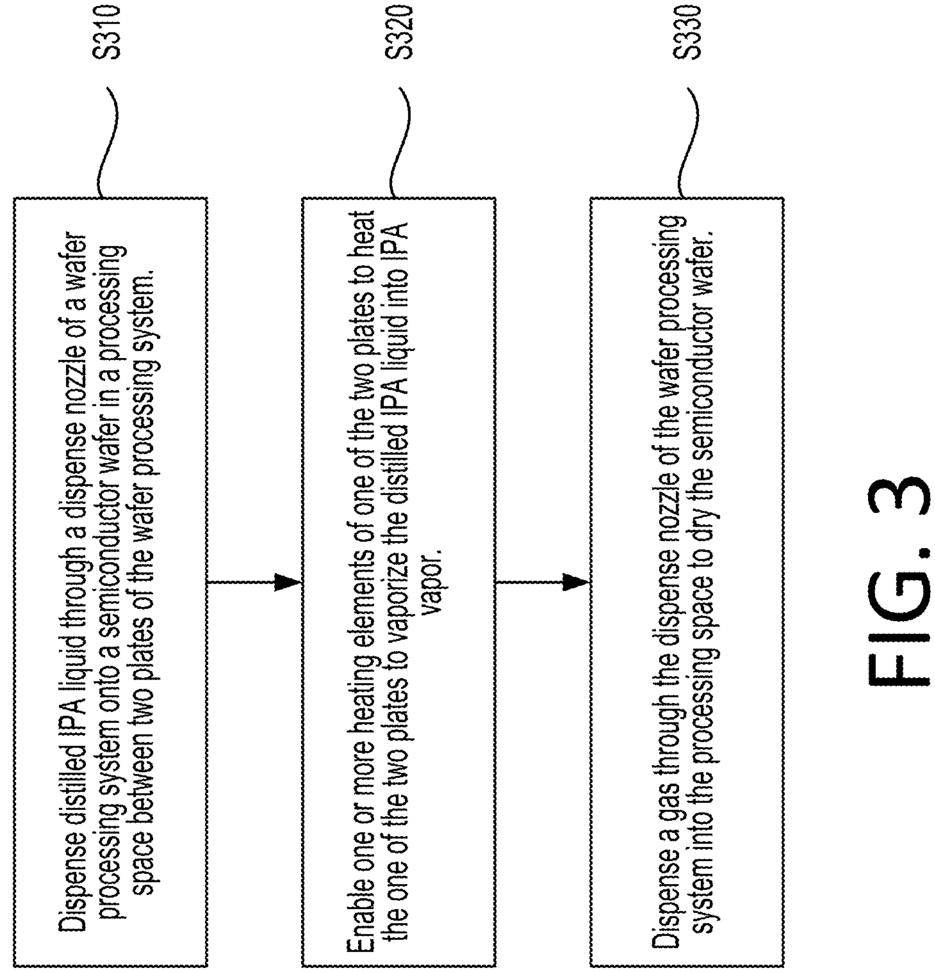
FIG. 3 illustrates a flowchart outlining a wafer cleaning process according to an embodiment of the disclosure.

FIG. 3 illustrates a flowchart outlining a wafer cleaning process 300 for cleaning a semiconductor wafer (e.g., the semiconductor wafer 101) according to an embodiment of the disclosure. The wafer cleaning process 300 can be implemented by a controller (e.g., the controller 150) of a wafer processing system (e.g., the wafer processing system 100). The wafer cleaning process 300 can be implemented as instructions stored in a non-transitory computer-readable medium. When executed by for example the controller of the wafer processing system, the instructions can cause the wafer processing system to perform the wafer cleaning process 300. The wafer cleaning process 300 may start at step S310.

At step S310, the wafer cleaning process 300 can dispense distilled IPA liquid through a dispense nozzle (e.g., one of the chemical dispense nozzles 130) of the wafer processing system onto a semiconductor wafer in a processing space (e.g., the processing space 120) between two plates (e.g., the functional plates 110) of the wafer processing system. Then, the wafer cleaning process 300 can proceed to step S320.

At step S320, the wafer cleaning process 300 can enable one or more heating elements (e.g., the heating elements 112) of one of the two plates to heat the one of the two plates to vaporize the distilled IPA liquid into IPA vapor. Then, the wafer cleaning process 300 can proceed to step S330.

At step S330, the wafer cleaning process 300 can dispense a gas through the dispense nozzle of the wafer processing system into the processing space to dry the semiconductor wafer.

In an embodiment, the wafer cleaning process 300 can exhaust the IPA vapor into a condensation system (e.g., the condensation system 140) of the wafer processing system, and condense the IPA vapor into the distilled IPA liquid.

In an embodiment, the wafer cleaning process 300 can dispense deionized water through the dispense nozzle of the wafer processing system onto the semiconductor wafer to rinse the semiconductor wafer.

In an embodiment, the gas is nitrogen gas.

In an embodiment, the one or more heating elements include a light source. In an example, the light source includes an LED array. In an example, the light source includes a laser array.

In an embodiment, the one of the two plates includes a heat exchanger.

In an embodiment, the one of the two plates includes a metal material coated with ethylene chlorotrifluoroethylene.

In an embodiment, the one of the two plates includes at least one of an impervious synthetic graphite material, a silicon carbide material, or a ceramic material.

Aspects of the disclosure provide a wafer processing system including a controller configured to control a dispense nozzle of the wafer processing system to dispense distilled IPA liquid onto a semiconductor wafer in a processing space between two plates of the wafer processing system. The controller is further configured to control one or more heating elements of one of the two plates to heat the one of the two plates to vaporize the distilled IPA liquid into IPA vapor, and control the dispense nozzle to dispense a gas into the processing space to dry the semiconductor wafer.

In an embodiment, the controller is configured to control a condensation system of the wafer processing system to exhaust the IPA vapor from the processing space, and control the condensation system to condense the IPA vapor into the distilled IPA liquid.

In an embodiment, the controller is configured to control the dispense nozzle to dispense deionized water onto the semiconductor wafer to rinse the semiconductor wafer.

In an embodiment, the gas is nitrogen gas.

In an embodiment, the one or more heating elements include a light source. In an example, the light source includes an LED array. In an example, the light source includes a laser array.

In an embodiment, the one of the two plates includes a heat exchanger.

In an embodiment, the one of the two plates includes a metal material coated with ethylene chlorotrifluoroethylene.

In an embodiment, the one of the two plates includes at least one of an impervious synthetic graphite material, a silicon carbide material, or a ceramic material.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A wafer processing system, comprising:

two plates, between which a process space is formed, wherein the two plates comprise heaters;

a dispense nozzle configured to dispense distilled isopropyl alcohol (IPA) liquid onto a semiconductor wafer in the processing space and configured to dispense a gas into the processing space to dry the semiconductor wafer; and a controller configured to control the dispense nozzle to dispense the distilled IPA liquid onto the semiconductor wafer, control one or more heaters of one of the two plates to heat the one of the two plates to vaporize the distilled IPA liquid into IPA vapor, and control the dispense nozzle to dispense the gas into the processing space to dry the semiconductor wafer, wherein the dispense nozzle is located under the processing space.

2. The wafer processing system of claim 1, wherein the dispense nozzle is further configured to dispense deionized water to the processing space to rinse the semiconductor wafer, and the controller is configured to: control the dispense nozzle to dispense the deionized water onto the semiconductor wafer to rinse the semiconductor wafer.

3. The wafer processing system of claim 1, wherein the gas is nitrogen gas.

4. The wafer processing system of claim 1, wherein the one or more heaters-heating elements include a light source.

5. The wafer processing system of claim 4, wherein the light source includes a light emitting diode (LED) array.

6. The wafer processing system of claim 4, wherein the light source includes a laser array.

7. The wafer processing system of claim 1, wherein the one of the two plates includes a heat exchanger.

8. The wafer processing system of claim 1, wherein the one of the two plates includes a metal material coated with ethylene chlorotrifluoroethylene.

9. The wafer processing system of claim 1, wherein the one of the two plates includes at least one of an impervious synthetic graphite material, a silicon carbide material, or a ceramic material.

10. The wafer processing system of claim 1, wherein the controller is configured to control the one or more heaters of the one of the two plates to heat the one of the two plates to vaporize the distilled IPA liquid into IPA vapor after the distilled IPA liquid is dispensed onto the semiconductor wafer and the dispense nozzle is closed.

* * * * *